(12) United States Patent
Zhang et al.

(10) Patent No.: US 10,558,241 B2
(45) Date of Patent: Feb. 11, 2020

(54) DISPLAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventors: Jiahao Zhang, Beijing (CN); Liqiang Chen, Beijing (CN); Pao Ming Tsai, Beijing (CN); Jianwei Li, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/985,096

(22) Filed: May 21, 2018

(65) Prior Publication Data

US 2019/0163238 A1 May 30, 2019

(30) Foreign Application Priority Data

Nov. 27, 2017 (CN) .......................... 2017 1 1204072

(51) Int. Cl.
| | | |
|---|---|---|
| *H01L 21/00* | (2006.01) | |
| *G06F 1/16* | (2006.01) | |
| *H01L 51/00* | (2006.01) | |
| *B32B 7/04* | (2019.01) | |
| *H01L 27/32* | (2006.01) | |

(52) U.S. Cl.
CPC .............. *G06F 1/1652* (2013.01); *B32B 7/04* (2013.01); *H01L 27/3276* (2013.01); *H01L 51/0097* (2013.01); *B32B 2457/20* (2013.01)

(58) Field of Classification Search
None
See application file for complete search history.

(56) References Cited

U.S. PATENT DOCUMENTS

| | | | |
|---|---|---|---|
| 10,270,059 | B2 | 4/2019 | Kim |
| 2017/0062760 | A1 | 3/2017 | Kim |
| 2017/0125505 | A1 | 5/2017 | Oh |
| 2017/0288005 | A1 | 10/2017 | Kawata |
| 2017/0317299 | A1 | 11/2017 | Choi et al. |
| 2019/0096975 | A1* | 3/2019 | Park ..................... H01L 27/3262 |

FOREIGN PATENT DOCUMENTS

| | | |
|---|---|---|
| CN | 104559902 A | 4/2015 |
| CN | 104752365 A | 7/2015 |
| CN | 106486520 A | 3/2017 |
| CN | 106653796 A | 5/2017 |
| CN | 107275337 A | 10/2017 |

OTHER PUBLICATIONS

First Chinese Office Action dated Mar. 22, 2019, received for corresponding Chinese Application No. 201711204072.8.

* cited by examiner

*Primary Examiner* — Reema Patel
(74) *Attorney, Agent, or Firm* — Kinney & Lange, P.A.

(57) ABSTRACT

A display substrate, a method for preparing the same, and a display device are provided in the embodiments of the disclosure. The display substrate comprises: a flexible substrate, the flexible substrate defining a connection region thereon; an inorganic structure layer on a side of the flexible substrate and in the connection region; a plurality of connection terminals on the inorganic structure layer and in the connection region; and a flexible filling layer in the inorganic structure layer and between two adjacent connection terminals of the plurality of connection terminals.

13 Claims, 3 Drawing Sheets

DISPLAY SUBSTRATE AND METHOD FOR PREPARING THE SAME, AND DISPLAY DEVICE

CROSS-REFERENCE TO RELATED DISCLOSURE

The present disclosure claims the benefit of Chinese Patent Application Disclosure No. 201711204072.8 filed on Nov. 27, 2017 in the State Intellectual Property Office of China, the whole disclosure of which is incorporated herein by reference.

BACKGROUND

Embodiments of the present disclosure relate generally to the technical field of displays, and more particularly to a display substrate and a method for preparing the same, and to a display device.

Flexible displays are display devices that are bendable and deformable. Such displays mainly use an organic flexible substrate instead of a rigid glass substrate, resulting in advantages thereof such as light weight, a slim, rollable and/or foldable profile, and low power consumption and the like. Flexible displays comprise various types such as a flexible liquid crystal display, a flexible organic electroluminescent display, and the like. At a connection region of a flexible display, there are provided connection terminals connecting with control elements such as chips and the like, for controlling display elements in the display to implement display functionality. The chips are directly attached onto a display substrate, i.e., by a COP (i.e., chip on panel) connection/bonding technology so as to obtain slim bezels.

SUMMARY

The embodiments of the present disclosure have been made to overcome or alleviate at least one aspect of the above mentioned disadvantages and/or shortcomings in the prior art, by providing a display substrate and a method for preparing the same, and a display device.

The following technical solutions are adopted in exemplary embodiments of the disclosure for achieving the above desired technical purposes.

According to an aspect of the exemplary embodiment of the present disclosure, there is provided a display substrate, comprising: a flexible substrate, the flexible substrate defining a connection region thereon; at least one inorganic structure layer on a side of the flexible substrate and in the connection region; a plurality of connection terminals on the at least one inorganic structure layer and in the connection region; and a flexible filling layer in the at least one inorganic structure layer and between two adjacent connection terminals of the plurality of connection terminals.

In an embodiment of the disclosure, the flexible filling layer comprises a flexible material filled in a cavity formed by etching in the at least one inorganic structure layer between the two adjacent connection terminals.

In an embodiment of the disclosure, the display substrate further comprises a plurality of metal wirings, being in the at least one inorganic structure layer on the flexible substrate and connected with the plurality of connection terminals, and extending in a first direction, with the flexible filling layer extending in a second direction perpendicular to the first direction.

In an embodiment of the disclosure, the at least one inorganic structure layer comprises an interlayer insulation layer on a side of the plurality of metal wirings facing away from the flexible substrate, and the plurality of connection terminals are on a side of the interlayer insulation layer facing away from the plurality of metal wirings, and a height of the flexible filling layer is not more than that of the interlayer insulation layer.

In an embodiment of the disclosure, the at least one inorganic structure layer further comprises a buffer layer, a first insulation layer and a second insulation layer overlapping over one another between the flexible substrate and the interlayer insulation layer.

In an embodiment of the disclosure, the buffer layer is on a side of the flexible substrate proximate to the plurality of connection terminals, the first insulation layer is on a side of the buffer layer facing away from the flexible substrate, the plurality of metal wirings are on a side of the first insulation layer facing away from the flexible substrate, the second insulation layer is on a side of the first insulation layer facing away from the flexible substrate and covers the plurality of metal wirings, and the interlayer insulation layer is on a side of the second insulation layer facing away from the plurality of metal wirings.

In an embodiment of the disclosure, each of the plurality of metal wirings is connected with a corresponding connection terminal of the plurality of connection terminals, and is arranged alongside another connection terminal of the plurality of connection terminals opposite to the corresponding connection terminal and extends towards the corresponding connection terminal.

In an embodiment of the disclosure, the flexible filling layer is in touch with the flexible substrate.

In an embodiment of the disclosure, the flexible filling layer is formed by a same material as the flexible substrate.

According to another aspect of the exemplary embodiment of the present disclosure, there is provided a display device, comprising the display substrate as above.

According to still another aspect of the exemplary embodiment of the present disclosure, there is provided a method for preparing a display substrate, the display substrate comprising a flexible substrate, the flexible substrate defining a connection region thereon, the method comprising: providing a plurality of connection terminals on the flexible substrate, the plurality of connection terminals being formed on at least one inorganic structure layer on a side of the flexible substrate and in the connection region; and providing a flexible filling layer in the at least one inorganic structure layer in the connection region, and between two adjacent connection terminals of the plurality of connection terminals.

In an embodiment of the disclosure, providing the flexible filling layer comprising: forming a cavity by etching at least partially the at least one inorganic structure layer in the connection region between the two adjacent connection terminals, the cavity extending in a second direction perpendicular to the first direction; and forming the flexible filling layer by filling a flexible material in the cavity.

In an embodiment of the disclosure, the method further comprises: providing a plurality of metal wirings in the at least one inorganic structure layer on the flexible substrate, the plurality of metal wirings being connected with the plurality of connection terminals and extending in a first direction, prior to providing the flexible filling layer.

In an embodiment of the disclosure, the method further comprises: forming the at least one inorganic structure layer prior to providing the plurality of metal wirings, comprising: providing a buffer layer and a first insulation layer on the flexible substrate, prior to providing the plurality of metal wirings; preparing the plurality of metal wirings on a side of the first insulation layer facing away from the flexible substrate; providing a second insulation layer and an interlay insulation layer on a side of the first insulation layer facing away from the flexible substrate, the second insulation layer covering the plurality of metal wirings; and finally providing a plurality of connection terminals on a side of the interlayer insulation layer facing away from the second insulation layer.

In an embodiment of the disclosure, forming a cavity by etching at least partially the at least one inorganic structure layer in the connection region between the two adjacent connection terminals further comprises: forming the cavity by etching both the interlayer insulation layer and the second insulation layer between the two adjacent metal wirings in the connection region.

In an embodiment of the disclosure, a height at a side of the flexible filling layer facing away from the flexible substrate is set to be not more than that of the interlayer insulation layer.

In an embodiment of the disclosure, forming a cavity by etching at least partially the at least one inorganic structure layer in the connection region between the two adjacent connection terminals further comprises: forming the cavity by etching the interlayer insulation layer, the second insulation layer, the first insulation layer and the buffer layer between the two adjacent metal wirings in the connection region.

In an embodiment of the disclosure, a height at a side of the flexible filling layer facing away from the flexible substrate is set to be not more than that of the interlayer insulation layer.

In an embodiment of the disclosure, the cavity extends at most to a surface of the flexible substrate.

In an embodiment of the disclosure, the flexible filling layer is formed by filling the cavity with a material which is the same as the flexible substrate.

The present summary is provided only by way of example, and not limitation. Other aspects of the present disclosure will be appreciated in view of the entirety of the present disclosure, including the entire text, claims, and accompanying figures.

Figure 1:
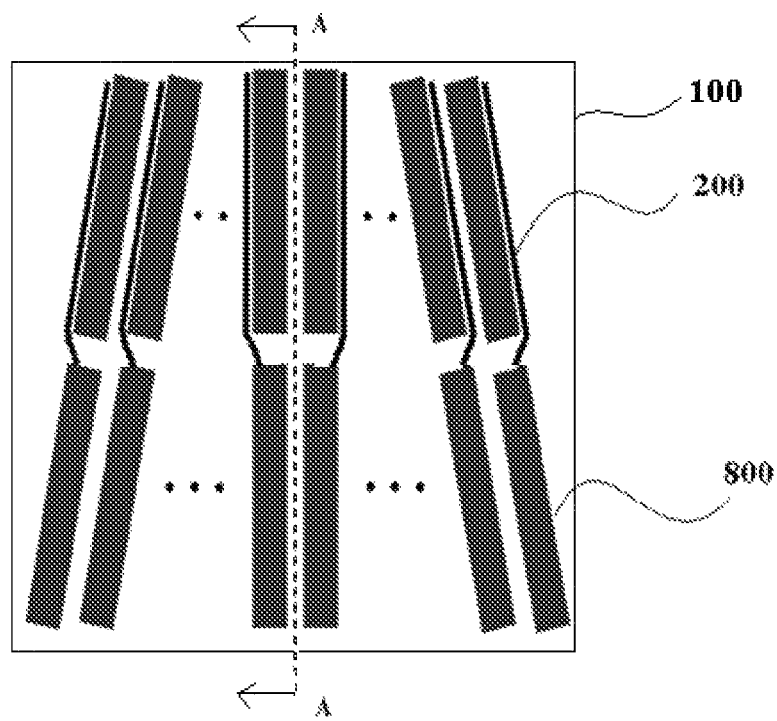
FIG. 1 illustrates a top view of a connection region of a display substrate in relevant art.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of a display substrate and a display device.

At present, metal wirings within a connection region of a flexible display may easily break. Specifically, during a process of directly bonding a chip onto a display substrate by a COP (i.e., chip on panel) connection/bonding technology, connection terminals provided on the connection region of the display substrate may be pressed; and since a substrate of the display substrate is a flexible one which is deformable under an action applied by a force, then the connection terminals may collapse downwards during a process of pressing the connection terminals, in turn resulting in a warpage phenomenon at regions around the connection terminals. Due to the existence of a variety of inorganic layer structures (such as interlayer insulation layers of TFT, and the like) among the metal wirings, a rigidity of the metal wirings may be influenced, increasing risk of breakage of the metal wirings.

Figure 3:
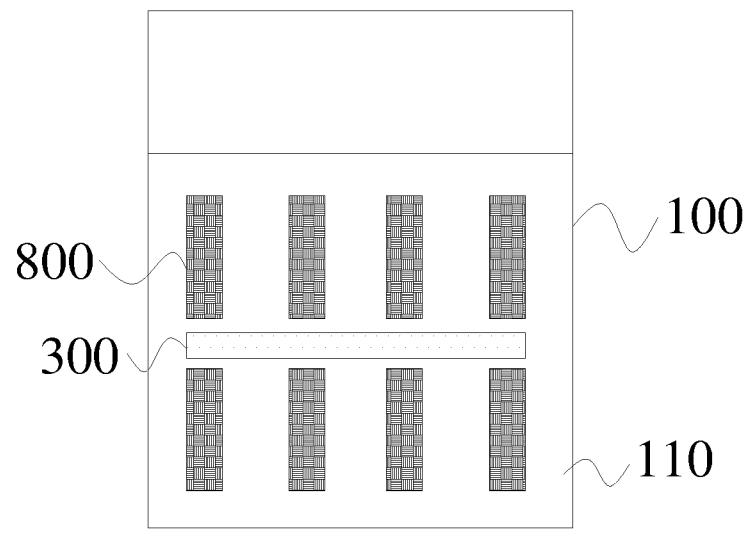
FIG. 3 illustrates a top view of a display substrate according to an embodiment of the disclosure.

According to a general technical concept of embodiments of the present disclosure, in an aspect of the embodiments of the disclosure, a display substrate is provided. According to embodiments of the disclosure, as illustrated in FIG. 3, the display substrate comprises a flexible substrate 100, a plurality of connection terminals 800 and a flexible filling layer 300. A connection region 110 is defined on the flexible substrate 100, and the plurality of connection terminals 800 are all provided at a same side of the flexible substrate 100 and located within the connection region 110. By way of example, the plurality of connection terminals 800 are for example arranged in opposite rows, e.g., in two rows opposite to each other as illustrated in FIG. 1; and the flexible filling layer 300 is disposed between two adjacent and opposed connection terminals 800 within the connection region 110, as illustrated in FIG. 3. Thereby, the risk of breakage of the metal wirings in the connection region is reduced, such that the display device formed by the display substrate may in turn be provided with steady circuit performances.

For facilitating understanding, an operation principle of the display substrate according to embodiments of the disclosure is above all set forth in brief.

Figure 2:
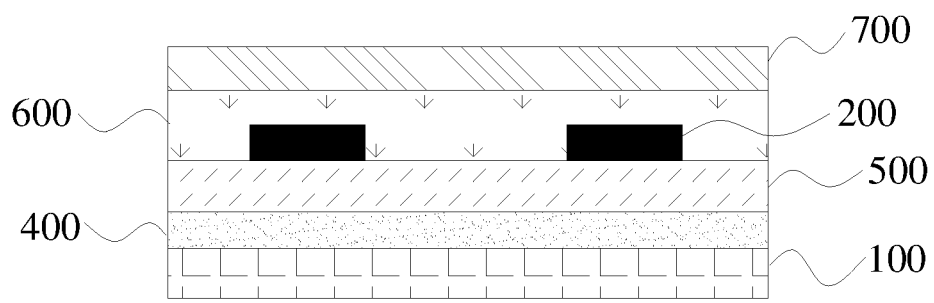
FIG. 2 illustrates a structural schematic view of the display substrate sectioned at cross section A-A as illustrated in FIG. 1.

In a flexible display in the relevant art, a chip (or chips) may be bonded directly onto a display substrate by COP bonding technology, so as to reduce cost and facilitate implementation of a slim bezel. The display substrate for example comprises a flexible substrate 100 on which a connection region is defined. As illustrated in FIG. 1, the illustrated region is the connection region, with a plurality of connection terminals 800 being provided on a same side of the flexible substrate in the connection region. Furthermore, e.g., the plurality of connection terminals 800 are for example arranged to be opposed rows, e.g., two rows opposite to each other as illustrated. In the connection region of the display substrate, there is further provided with a plurality of metal wirings 200. Each of the plurality of metal wirings 200 is for example connected with a corresponding one of the plurality of connection terminals 800, and arranged alongside another connection terminal of the plurality of connection terminals opposite to the connected corresponding one of the plurality of connection terminals 800, and extends towards the connected corresponding one of the plurality of connection terminals 800. Moreover, by way of example, as illustrated, a structure in a region in which the metal wirings are provided in the relevant art is shown in FIG. 2. FIG. 2 illustrates a structural schematic view of the display substrate sectioned at cross section A-A as illustrated in FIG. 1. The display substrate comprises a flexible substrate 100, a plurality of inorganic structure layers and a plurality of metal wirings 200 provided in the plurality of inorganic structure layers. The plurality of inorganic structure layers for example comprise various structures such as a buffer layer 400, a first insulation layer 500, a second insulation layer 600 and an interlayer insulation layer 700 and the like overlapping with one another on the flexible substrate 100. The plurality of metal wirings 200 are for example provided on a surface of the first insulation layer 500 at a side thereof facing towards the second insulation layer 600 and is covered by the second insulation layer 600. During a process of bonding a chip onto the connection region of the display substrate, terminals of the chip to be bonded are firstly aligned with and then pressed against the connection terminals 800 on the connection region of the display substrate so as to implement a connection therebetween and thus to complete the bonding process. Since the flexible substrate 100 is formed by a flexible material and is deformable when being subject to a force, then, when during the process of pressing, the connection terminals 800 pressed against by the terminals of the chip to be bonded may collapse downwards, in turn resulting in a warpage phenomenon at regions around the connection terminals. Furthermore, since a structure among the metal wirings 200 is formed by all inorganic layers (e.g., the buffer layer 400, the first insulation layer 500, the second insulation layer 600 and the interlayer insulation layer 700) whose structural rigidity tend to be insufficient to resist such collapse and warpage deformation, such that rigidity of the metal wirings may also be influenced due to the existence of the structure formed by these inorganic layers, which may readily result in a breakage of the structure and increase the risk of breakage of the metal wirings 200 and in turn influence the performance of the flexible display.

According to an embodiment of the disclosure, the flexible filling layer 300 is used instead of the plurality of inorganic structure layer among the connection terminals 800. On one hand, in a condition that the connection terminals collapse downwards, the flexible filling layer 300 may absorb most of stresses so as to have a buffer effect and to decrease the risk of breakage of the metal wirings 200. On the other hand, the flexible filling layer 300 is formed by a flexible material and thus has a relatively superior ductility or resilience so as to facilitate preventing cracks from extending/propagating and avoiding the breakage of the plurality of metal wirings. As such, it facilitates providing steady circuit performances by the display device formed by the display substrate.

Since it is required to provide circuit structures such as TFT and the like on the substrate and said circuit structures are typically prepared by depositing a whole layer of material and then by patterning processes, then, it is inevitable that there are a plurality of inorganic structure layers such as the first insulation layer and the buffer layer and the like beneath the metal wirings. And it may be difficult to implement a complete elimination of aforementioned inorganic structure layers by practical processes. And it is found by the inventor that, in a condition that it is required to replace inorganic structure layers between two adjacent metal wirings (e.g., metal wirings between two adjacent connection terminals), since there is a relatively smaller area required to be covered by the inorganic structure layers between two adjacent metal wirings than an overall area covered by the whole display substrate, then, specific processes may be saved by only replacing the inorganic structure layers between two adjacent metal wirings, and a sufficient buffer may still be provided thereby.

Figure 4:
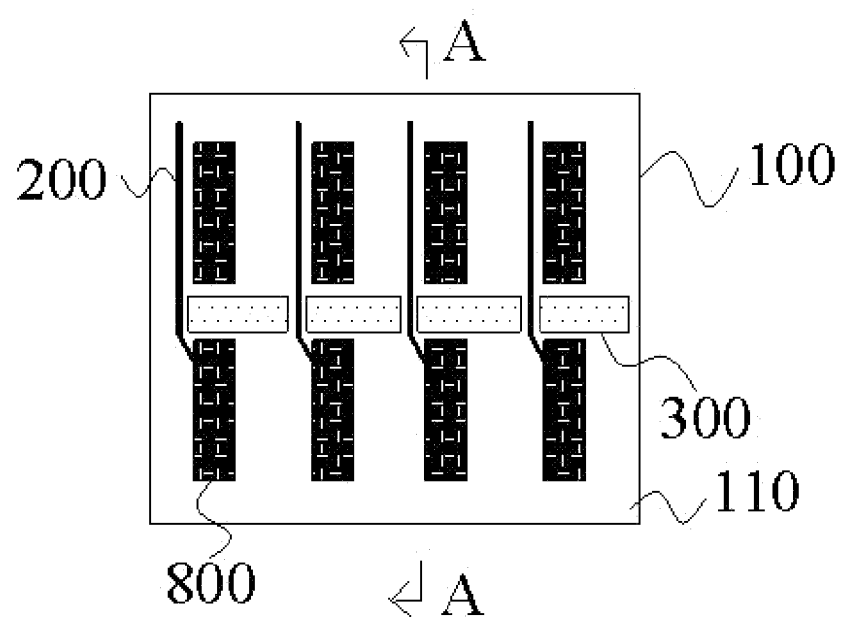
FIG. 4 illustrates a top view of a connection region of a display substrate according to an embodiment of the disclosure.

Then various structures of the display substrate may be set forth in detail hereinafter according to specific embodiments of the disclosure:

According to an embodiment of the disclosure, the flexible filling layer 300 is for example formed by forming a cavity by etching at least partially the inorganic structure layers between two adjacent connection terminals 800 and then filling the flexible material as an alternative material in the cavity. And according to an embodiment of the disclosure, as illustrated in FIG. 4, the display substrate comprises a flexible substrate 100, at least one inorganic structure layer, the plurality of connection terminals 800 and the flexible filling layer 300. The flexible substrate 100 defines a connection region 110 thereon. The region as illustrated is the connection region 110, and as illustrated in FIG. 2 and as set forth hereinafter, the at least one inorganic structure layer is provided on a side of the flexible substrate and in the connection region 110. The plurality of connection terminals 800 are provided on a same side of the flexible substrate, on the at least one inorganic layer and in the connection region 110. Furthermore, by way of example, the plurality of connection terminals 800 are for example arranged in opposed rows, e.g., in two rows opposite to each other as illustrated. As illustrated in FIG. 4, the display substrate comprises the plurality of metal wirings 200 extending in a first direction, the plurality of metal wirings 200 being provided on the flexible substrate 100 and connected with the connection terminals 800. For example, each of the plurality of metal wirings 200 is connected with a corresponding one of the plurality of connection terminals 800 and arranged alongside another connection terminal of the plurality of connection terminals opposite to the corresponding connection terminal and extends towards the corresponding one of the plurality of connection terminals 800.

Thereby, an interconnection structure for electrical communication is formed. Moreover, by way of example, the flexible filling layer comprises a flexible material filled in a cavity formed by etching in the at least one inorganic structure layer between two adjacent connection terminals. According to some embodiments of the disclosure, as illustrated in FIG. 4, the first direction is shown to be a vertical direction, and the flexible filling layer 300 is for example chosen to be arranged to extend in a second direction perpendicular to the first direction, then the second direction is shown to be a horizontal direction. Thereby, when the connection terminals collapse downwards, the flexible filling layer around the connection terminals have a buffer effect and decrease the risk of breakage of the metal wirings adjacent to the connection terminals. Certainly, according to another alternative embodiment of the disclosure, the flexible filling layer 300 is for example chosen to be arranged to extend in the first direction; in other words, the flexible filling layer 300 extends in a same direction as the metal wirings 200, and the flexible filling layer 300 is formed within the inorganic structure layer and located between adjacent connection terminals 800.

Figure 5:
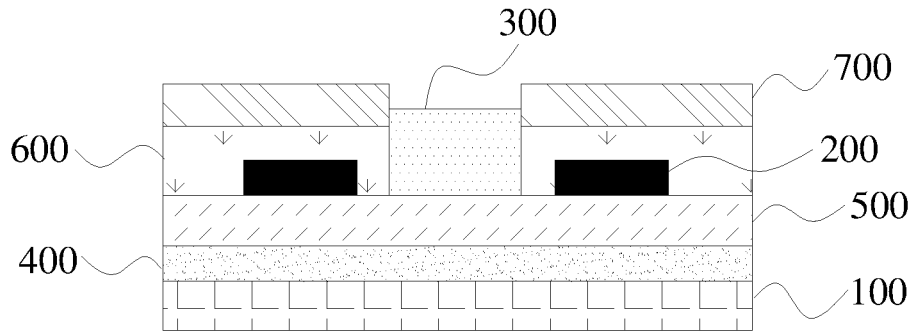
FIG. 5 illustrates a structural schematic view of a connection region of a display substrate according to an embodiment of the disclosure.

It should be understood by those skilled in the art that, the at least one inorganic structure layer among connection terminals 800 may for example comprise a buffer layer 400, a first insulation layer 500, a second insulation layer 600 and an interlayer insulation layer 700. The buffer layer 400 is provided on a side of the flexible substrate 100 proximate to the plurality of connection terminals 800, the first insulation layer 500 is provided on a side of the buffer layer 400 facing away from the flexible substrate 100, the plurality of metal wirings 200 are provided on a side of the first insulation layer 500 facing away from the flexible substrate 100, and the second insulation layer 600 is provided on a side of the first insulation layer 500 facing away from the flexible substrate 100 and covers the plurality of metal wirings 200, and the interlayer insulation layer 700 is provided on a side of the second insulation layer 600 facing away from the metal wirings 200. According to an embodiment of the disclosure, a structure having the region of the plurality of metal wirings is arranged; as illustrated in FIG. 5, the flexible filling layer 300 is formed by forming a cavity above all by etching at least partially the interlayer insulation layer 700 and the second insulation layer 600 between two adjacent metal wirings 200 (i.e., metal wirings between two adjacent connection terminals) and by filling the flexible material then as an alternative material in the cavity thus etched. In other words, the flexible filling layer 300 is provided by extending through/penetrating both a portion of the interlayer insulation layer 700 and a portion of the second insulation layer 600 between the two adjacent metal wirings 200 within the connection region 110. As such, in a condition that the connection terminals collapse, the flexible filling layer alternatively functions to have a buffer effect so as to decrease the risk of breakage of the metal wirings.

Figure 6:
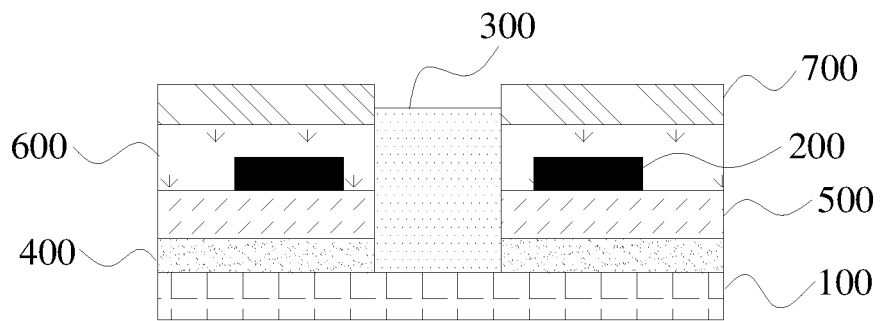
FIG. 6 illustrates a structural schematic view of a connection region of a display substrate according to another embodiment of the disclosure.

According to an embodiment of the disclosure, as illustrated in FIG. 6, the flexible filling layer 300 is for example formed by forming a cavity above all by etching at least partially the interlayer insulation layer 700, the second insulation layer 600, the first insulation layer 500 and the buffer layer 400 between two adjacent metal wirings (i.e., corresponding to metal wirings between two adjacent connection terminals) and by filling the flexible material then as an alternative material in the cavity thus etched. In other words, the flexible filling layer 300 is provided by extending through/penetrating a portion of the interlayer insulation layer 700, a portion of the second insulation layer 600, a portion of the first insulation layer 500 and a portion of the buffer layer 400 between the two adjacent metal wirings 200 within the connection region 110, and the flexible filling layer 300 is for example in touch with the flexible substrate 100. As such, as compared with the embodiment shown in FIG. 5, the flexible filling layer 300 in the embodiment shown in FIG. 6 is even thicker, further increasing the buffer effect of the flexible filling layer and further decreasing the risk of breakage of the metal wirings. According to an embodiment of the disclosure, the flexible filling layer 300 and the flexible substrate 100 are for example chosen to be formed by an identical material. Thereby, since the flexible filling layer 300 and the flexible substrate 100 are in touch with each other in the embodiment as illustrated in FIG. 6, then the flexible filling layer 300 and the flexible substrate 100 cooperate with each other so as to implement a buffer to pressure applied thereon, and to further increase the buffer effect of the flexible filling layer and to further decrease the risk of breakage of the metal wirings. Furthermore, the flexible filling layer 300 and the flexible substrate 100 are formed by a same material, facilitating mitigating/alleviating a level of warpage of the flexible substrate 100 and further decreasing damage to a fragile structure on the flexible substrate 100.

According to an embodiment of the disclosure, the flexible filling layer 300 is for example formed by at least one of polyimide (PI), Polythylene Naphthalate (PEN), and Polyethylene Terephthalate (PET). Each of above materials has a relatively superior ductility or resilience so as to facilitate deformation under an action applied by a force and in turn to function to have the buffer effect. Therefore, the flexible filling layer is formed by above materials, such that in a condition that the connection terminals collapse downwards, the flexible filling layer may absorb most of the stresses so as to have the buffer effect and in turn to decrease the risk of breakage of the metal wirings, and also to prevent cracks from extending/propagating and further to avoid the breakage of the plurality of metal wirings.

According to an embodiment of the disclosure, the flexible filling layer 300 is provided adjacent to the connection terminals 800. Thereby, in a condition that the connection terminals collapse downwards, the flexible filling layer surrounding the connection terminals may have the buffer effect so as to decrease the risk of breakage of metal wirings. And it should be noticed specifically that, in the embodiments of the disclosure, the expression "provided adjacent to the connection terminals" refers to that the flexible filling layer 300 may be provided at connection terminals 800 between two adjacent metal wirings 200 (i.e., corresponding to metal wirings between two adjacent connection terminals). It should be understood by those skilled in the art that, the smaller a distance between the flexible filling layer 300 and a corresponding connection terminal is, the more beneficial it may be to mitigate the pressure at the corresponding connection terminal.

According to an embodiment of the disclosure, a height at a side of the flexible filling layer 300 facing away from the flexible substrate 100 is set to be not more than that of the interlayer insulation layer 700 in the connection region 110. Thereby, it is ensured that none of the connection(s) with the chip may be influenced, and it is also ensured that there may be anisotropy between terminals on the chip to be bonded and corresponding connection terminals on the display substrate.

According to an embodiment of the disclosure, the metal wirings 200 are for example formed by molybdenum or Ti/Al/Ti. Therefore, the metal wirings may have good electrical conductivity. According to an embodiment of the disclosure, a thickness of a metal wiring may be 200-500 Å.

In another aspect of embodiments of the disclosure, a display device is provided. According to an embodiment of the disclosure, the display device comprises aforementioned display substrate. Therefore, the display device possesses all characteristics and advantages of the display substrate, without repeating herein any more. In conclusion, the display device may possess excellent properties.

Figure 7:
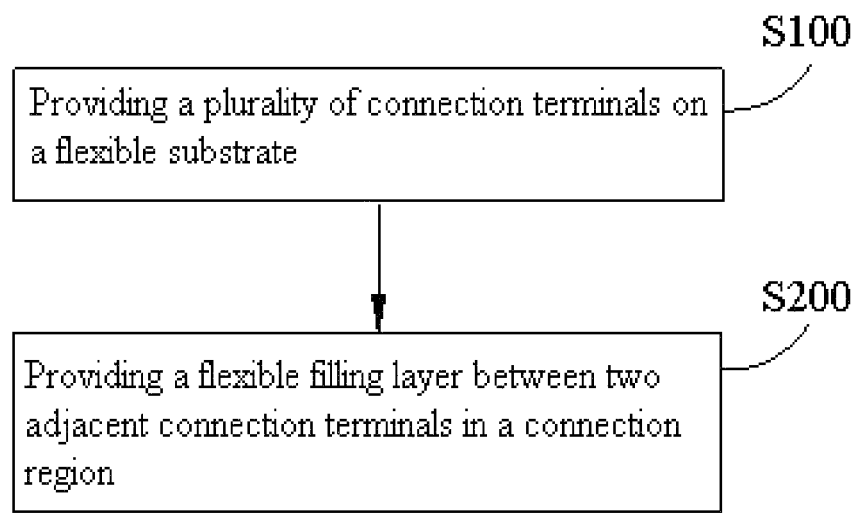
FIG. 7 illustrates a schematic flow chart of a method for preparing the display substrate according to an embodiment of the disclosure.

In still another aspect of embodiments of the disclosure, a method for preparing a display substrate is also provided. According to an embodiment of the disclosure, the display substrate prepared by the method is for example the display substrate as set forth above. Therefore, such display substrate prepared by the method may for example possess characteristics and advantages similar with that of the aforementioned display substrate, without repeating herein any more. According to an embodiment of the disclosure, the display substrate prepared by the method comprises a flexible substrate on which a connection region is defined. According to an exemplary embodiment, as illustrated in FIG. 7, the method comprises:

S100: providing a plurality of connection terminals on the flexible substrate; and S200: providing a flexible filling layer between two adjacent connection terminals in the connection region.

According to an embodiment of the disclosure, in the step S100, a plurality of connection terminals are provided on the flexible substrate. The plurality of connection terminals are formed on at least one inorganic structure layer provided on a side of the flexible substrate, and in the connection region. According to an embodiment, the plurality of connection terminals are located in the connection region of the flexible substrate and configured to bond respectively with the terminals on the chip to be bonded, so as to implement electrical connections therebetween. According to an embodiment, the flexible substrate may be provided with a plurality of metal wirings thereon extending in a first direction, the plurality of metal wirings being connected with the connection terminals, and each of the plurality of metal wirings being for example connected with a corresponding one of the connection terminals, and being arranged alongside another connection terminal of the plurality of connection terminals opposite to the corresponding one of the connection terminals and extending towards the latter. Both component material and thickness of the metal wirings are depicted in detail as above, without repeating herein any more. The method for preparing the metal wirings are not limited specifically and such method may be designed depending on specific application context/scenarios by those skilled in the art. By way of example, according to an embodiment, the metal wirings may be prepared by a processing method such as magnetron sputtering, or plasma chemical vapor deposition, etc.

As mentioned above, before providing the metal wirings, a plurality of inorganic structure layers may further be provided among connection terminals. Specifically, the plurality of inorganic structure layers may for example comprise a buffer layer, a first insulation layer, a second insulation layer and an interlay insulation layer. As to specific positioning of above inorganic structure layers, detailed depiction is set forth as above, without repeating herein any more. Before preparing the metal wirings, e.g., by providing the buffer layer and the first insulation layer on the flexible substrate, and then by preparing the metal wirings on a side of the first insulation layer facing away from the flexible substrate, and next, by providing both the second insulation layer (which covers the metal wirings) and the interlayer insulation layer on a side of the first insulation layer facing away from the flexible substrate, and finally by providing connection terminals on a side of the interlayer insulation layer facing away from the second insulation layer. The method for preparing above inorganic structure layer may not be limited specifically, and such method may be designed depending on specific application context/scenarios by those skilled in the art. By way of example, above inorganic structure layer may be prepared by methods such as plasma enhanced chemical vapor deposition (PECVD) method, lithography, etching, and the like.

According to an embodiment of the disclosure, as illustrated in FIG. 7, in the step S200, the flexible filling layer is provided in the organic structure layers in the connection region, between two adjacent connection terminals. According to an embodiment of the disclosure, e.g., the flexible filling layer may be formed by a lithography process. Specifically, a cavity is formed above all, e.g., by etching at least partially the inorganic structure layers between two adjacent connection terminals in the connection region. The cavity for example extends in a second direction perpendicular to the first direction. Next, the cavity is filled with a flexible material so as to form the flexible filling layer therein. In this way, the flexible filling layer may be obtained by simple production processes.

As mentioned above, before providing the flexible filling layer, the plurality of metal wirings may be provided within the inorganic structure layers on the flexible substrate which metal wirings are connected with the plurality of connection terminals, the plurality of metal wirings extending in a first direction. According to an embodiment of the disclosure, the cavity may for example extend in a first direction; in other words, the cavity extends in a same direction as the metal wirings, and the cavity is located between adjacent connection terminals. According to another embodiment, alternatively, the cavity may for example extend in a second direction perpendicular to the first direction. According to a specific embodiment of the disclosure, e.g., the flexible filling layer is formed by forming a cavity above all by etching the interlayer insulation layer and the second insulation layer between two adjacent metal wirings (i.e., metal wirings between two adjacent connection terminals) in the connection region and by filling the flexible material then as an alternative material in the cavity thus etched. Thereby, in a condition that the connection terminals collapse downwards, the flexible filling layer may for example have the buffer effect so as to decrease the risk of breakage of metal wirings and to avoid breakage of the plurality of metal wirings.

According to an embodiment of the disclosure, the cavity for example extends at most to a surface of the flexible substrate. According to a specific embodiment of the disclosure, e.g., the flexible filling layer is formed by forming a cavity above all by etching the interlayer insulation layer, the second insulation layer, the first insulation layer and the buffer layer between two adjacent metal wirings (i.e., metal wirings between two adjacent connection terminals) in the connection region and by filling the flexible material then as an alternative material in the cavity thus etched. In other words, the flexible filling layer may for example be in touch with the flexible substrate. Thereby, the buffer effect of the flexible filling layer may be increased, and the risk of breakage of the metal wirings may further be decreased, preventing breakage of the plurality metal wirings. According to an embodiment of the disclosure, the flexible filling layer and the flexible substrate are for example formed by an identical material, i.e., the flexible filling layer is formed by filling the cavity with a same material as the flexible substrate. Thereby, the flexible filling layer and the flexible substrate cooperate with each other so as to implement a buffer to pressure applied thereon, and to further increase the buffer effect of the flexible filling layer. The material of the flexible filling layer is depicted in detail as above, without repeating herein any more.

The height of the flexible filling layer is also depicted in detail as above, without repeating herein any more. By way of example, according to an embodiment of the disclosure, a height at a side of the flexible filling layer facing away from the flexible substrate is set to be not more than that of the interlayer insulation layer. Thereby, it is ensured that none of the connection(s) with the chip may be influenced, and it is also ensured that there may be anisotropy between terminals on the chip to be bonded and corresponding connection terminals on the display substrate.

In conclusion, since the display substrate prepared by the method may be provided with a flexible filling layer, then in a condition that the connection terminals collapse downwards, the flexible filling layer may absorb most of stresses so as to have a buffer effect and to decrease the risk of breakage of the metal wirings; and the flexible filling layer has a relatively superior ductility or resilience so as to facilitate preventing cracks from extending/propagating and avoiding the breakage of the plurality of metal wirings. Thereby, the risk of breakage of the plurality of metal wirings in the connection region of the display substrate may be decreased significantly so as to enhance performance of the display device formed by the display substrate.

It should be appreciated for those skilled in this art that the above embodiments are intended to be illustrative, not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The invention claimed is:

1. A display substrate comprising:
a flexible substrate, the flexible substrate defining a connection region thereon;
at least one inorganic structure layer on a side of the flexible substrate and in the connection region;
a plurality of connection terminals on the at least one inorganic structure layer and in the connection region; and
a flexible filling layer in the at least one inorganic structure layer and between two adjacent connection terminals of the plurality of connection terminals;
wherein the flexible filling layer comprises a flexible material filled in a cavity formed by etching in the at least one inorganic structure layer between the two adjacent connection terminals;
wherein the display substrate further comprises a plurality of metal wirings, being in the at least one inorganic structure layer on the flexible substrate and connected with the plurality of connection terminals, and extending in a first direction, with the flexible filling layer extending in a second direction perpendicular to the first direction; and
wherein the at least one inorganic structure layer comprises an interlayer insulation layer on a side of the plurality of metal wirings facing away from the flexible substrate, and the plurality of connection terminals are on a side of the interlayer insulation layer facing away from the plurality of metal wirings, and a height of the flexible filling layer is not more than that of the interlayer insulation layer.

2. The display substrate according to claim 1, wherein the at least one inorganic structure layer further comprises a buffer layer, a first insulation layer and a second insulation layer overlapping over one another between the flexible substrate and the interlayer insulation layer.

3. The display substrate according to claim 2, wherein the buffer layer is on a side of the flexible substrate proximate to the plurality of connection terminals, the first insulation layer is on a side of the buffer layer facing away from the flexible substrate, the plurality of metal wirings are on a side of the first insulation layer facing away from the flexible substrate, the second insulation layer is on a side of the first insulation layer facing away from the flexible substrate and covers the plurality of metal wirings, and the interlayer insulation layer is on a side of the second insulation layer facing away from the plurality of metal wirings.

4. The display substrate according to claim 1, wherein each of the plurality of metal wirings is connected with a corresponding connection terminal of the plurality of connection terminals, and is arranged alongside another connection terminal of the plurality of connection terminals opposite to the corresponding connection terminal and extends towards the corresponding connection terminal.

5. The display substrate according to claim 1, wherein the flexible filling layer is in touch with the flexible substrate.

6. The display substrate according to claim 5, wherein the flexible filling layer is formed by a same material as the flexible substrate.

7. A display device, comprising the display substrate according to claim 1.

8. A method for preparing a display substrate, the display substrate comprising a flexible substrate, the flexible substrate defining a connection region thereon, the method comprising:
providing a plurality of connection terminals on the flexible substrate, the plurality of connection terminals being formed on at least one inorganic structure layer on a side of the flexible substrate and in the connection region; and providing a flexible filling layer in the at least one inorganic structure layer in the connection region, and between two adjacent connection terminals of the plurality of connection terminals;

wherein the flexible filling layer is formed by filling a flexible material in a cavity formed by etching in the at least one inorganic structure layer between the two adjacent connection terminals;

wherein a plurality of metal wirings are further provided in the at least one inorganic structure layer on the flexible substrate, the plurality of metal wirings being connected with the plurality of connection terminals, and extending in a first direction, with the flexible filling layer extending in a second direction perpendicular to the first direction; and wherein an interlayer insulation layer is provided in the at least one inorganic structure layer, on a side of the plurality of metal wirings facing away from the flexible substrate, and the plurality of connection terminals are provided on a side of the interlayer insulation layer facing away from the plurality of metal wirings, with a height of the flexible filling layer being not more than that of the interlayer insulation layer.

9. The method according to claim 8, further comprising forming the at least one inorganic structure layer prior to providing the plurality of metal wirings; and additionally comprising:

providing a buffer layer and a first insulation layer on the flexible substrate, prior to providing the plurality of metal wirings;

preparing the plurality of metal wirings on a side of the first insulation layer facing away from the flexible substrate;

providing a second insulation layer and the interlayer insulation layer on a side of the first insulation layer facing away from the flexible substrate, the second insulation layer covering the plurality of metal wirings; and finally providing a plurality of connection terminals on a side of the interlayer insulation layer facing away from the second insulation layer.

10. The method according to claim 9, wherein the cavity is formed by etching both the interlayer insulation layer and the second insulation layer between the two adjacent metal wirings in the connection region.

11. The method according to claim 9, wherein the cavity is formed by etching the interlayer insulation layer, the second insulation layer, the first insulation layer and the buffer layer between the two adjacent metal wirings in the connection region.

12. The method according to claim 8, wherein the cavity extends at most to a surface of the flexible substrate.

13. The method according to claim 12, wherein the flexible filling layer is formed by filling the cavity with a material which is the same as the flexible substrate.

* * * * *